(12) United States Patent
Conlin

(10) Patent No.: US 7,673,206 B2
(45) Date of Patent: Mar. 2, 2010

(54) METHOD AND SYSTEM FOR ROUTING SCAN CHAINS IN AN ARRAY OF PROCESSOR RESOURCES

(75) Inventor: Richard Conlin, Groton, MA (US)

(73) Assignee: Tilera Corporation, Westborough, MA (US)

( * ) Notice: Subject to any disclaimer, the term of this patent is extended or adjusted under 35 U.S.C. 154(b) by 238 days.

(21) Appl. No.: 11/901,184

(22) Filed: Sep. 14, 2007

(65) Prior Publication Data

US 2009/0077437 A1 Mar. 19, 2009

(51) Int. Cl.
*G01R 31/28* (2006.01)

(52) U.S. Cl. ............................ 714/729; 714/25; 714/30; 714/718; 714/724; 714/725; 714/726; 714/727

(58) Field of Classification Search ........................ None
See application file for complete search history.

(56) References Cited

U.S. PATENT DOCUMENTS

| | | | | |
|---|---|---|---|---|
| 4,864,579 A * | 9/1989 | Kishida et al. | ............... | 714/726 |
| 6,059,836 A * | 5/2000 | Liguori | ........................ | 703/23 |
| 6,242,269 B1 * | 6/2001 | Whetsel | ....................... | 438/11 |
| 6,868,532 B2 * | 3/2005 | Nadeau-Dostie et al. | ........ | 716/4 |
| 6,897,678 B2 * | 5/2005 | Zaveri et al. | ................... | 326/39 |
| 6,957,403 B2 * | 10/2005 | Wang et al. | ...................... | 716/3 |
| 7,137,086 B2 * | 11/2006 | Abramovici | ..................... | 716/4 |
| 7,301,836 B1 * | 11/2007 | Raghavan et al. | ............ | 365/201 |
| 7,353,440 B2 * | 4/2008 | Ohwada et al. | ............. | 714/726 |
| 7,424,658 B1 * | 9/2008 | Ghosh Dastidar | ........... | 714/738 |
| 2005/0055615 A1 * | 3/2005 | Agashe et al. | ............... | 714/727 |
| 2006/0282727 A1 * | 12/2006 | Hoshaku | ...................... | 714/726 |
| 2006/0282729 A1 * | 12/2006 | Dastidar | ...................... | 714/726 |
| 2009/0063919 A1 * | 3/2009 | Whetsel | ...................... | 714/726 |

\* cited by examiner

*Primary Examiner*—John P Trimmings

(57) ABSTRACT

The present invention provides a method and system for routing a group of scan chains to a group of processor resources in a semiconductor chip. The group of processor resources is arranged in rows or columns. The group of processor resources in each row or column is connected through a plurality of scan chains. The first processor resource in each row or column is connected to input scan-chain pins, and the last processor resource in each row or column is connected to output scan-chain pins. A test-pattern generator, generating test signals, sends the test signals to the group of processor resources by using the group of scan chains within the semiconductor chip. The responses of the processor resources corresponding to the test signals are analyzed to detect and locate any error in the manufacture of the semiconductor chip.

4 Claims, 4 Drawing Sheets

Prior Art FIG. 1

METHOD AND SYSTEM FOR ROUTING SCAN CHAINS IN AN ARRAY OF PROCESSOR RESOURCES

BACKGROUND OF THE INVENTION

The present invention relates in general to the testing of an integrated circuit designed within a semiconductor chip. In particular, the invention relates to routing scan chains in the semiconductor chip, to send test signals generated by a test pattern generator to test the integrated circuit within the semiconductor chip.

Scan chains are primarily used to transfer test signals during the process of testing an integrated circuit designed within a semiconductor chip. These scan chains use wiring connections to transfer the test signals to the required location of the integrated circuit within the semiconductor chip. The scan chains ensure that the process of testing the integrated circuit chips can be observed and controlled, such that the test signals can be routed to a desirable location within the semiconductor chip. The test pattern generator observes the signal responses at various locations of the integrated circuit. These generated responses correspond to the test signals. Further, these signal responses are analyzed for various errors that may result in the malfunctioning of the integrated circuit during its functional operation. The scan chains, by sending the test signals to the desired locations of the integrated circuits, significantly reduce the burden on the test pattern generator. Additionally, scan chains also help to reduce the overall testing time of the semiconductor chip.

The process of routing the scan chains is performed with care, so that the routing of critical signals by using scan chains is not adversely affected. Any adverse effect can result in congestion, impedance mismatching, electromagnetic interference, and negative impact on timing, for example, time delay, and the like. The level of complexity of a scan chain on a semiconductor chip depends on the integrated circuit on the semiconductor chip. The conventional hierarchical design for routing scan chains on a semiconductor chip with a group of processor resources arranged in tiled or multi-core manner is very complex. This is because each processor resource in the group of processor resources is connected at the top level, separately, through a set of scan chains, to the Input/Output (I/O) pins of the semiconductor chip. This makes the routes of scan chains lengthy and cumbersome, even for a semiconductor chip with a reasonably small number of processor resources. Further, these lengthy routes and cumbersome design create problems such as routing congestion at the top level, timing problems in critical paths, and the like. With an increase in the number of processor resources on the semiconductor chip, problems related to the routing of scan chains in it are amplified. Additionally, the complex design of the semiconductor chip makes time delay a significant problem. The time-delay problem becomes more significant when test signals need to be transferred to locations present in the middle of the semiconductor chip.

In light of the foregoing discussion, there is a need for a method and system for routing scan chains, to reduce the complexity of testing a semiconductor chip. Such a method and system would eliminate the problem of time delay in critical functional signals within the semiconductor chip. Further, the number of flops in the scan chains connecting the group of processor resources to transfer the test signals can be efficiently managed. Moreover, the semiconductor chip area would be efficiently utilized and would be scalable. As a result, the system could scale with the increase in the number of processor resources, if they are added to the system.

SUMMARY OF THE INVENTION

An object of the present invention is to provide a method and system for routing a group of scan chains to a group of processor resources in a semiconductor chip. Such a method and system provides a routing schematic for the group of scan chains, to route test signals to the group of processor resources on the semiconductor chip. These test signals are generated by a test-pattern generator.

Another object of the present invention facilitates a scan-chain routing scheme that utilizes the semiconductor chip area efficiently by eliminating long-scan chain routes.

Another object of the present invention is to provide a method and system that minimizes the timing impact on critical functional signals and eliminates top-level scan insertion by reducing the wire length of the group of scan chains.

Yet another object of the present invention is to provide a scalable routing schematic to route the scan chains. As a result, scan chains can scale without adding complexity to the semiconductor chip.

Various embodiments of the present invention provide a method and system for routing a group of scan chains to a group of processor resources in a semiconductor chip. The group of processor resources is arranged in rows or columns and is connected separately through a scan chain. The first processor resource in each row or column is connected to input scan chain pins, and the last processor resource in each row or column is connected to output scan chain pins. A test-pattern generator generating the test signals sends these signals to the group of processor resources by using the group of scan chains, which is present within the semiconductor chip. The responses of the processor resources corresponding to the test signals are analyzed to detect and locate any error in the manufacture of the semiconductor chip.

BRIEF DESCRIPTION OF THE DRAWINGS

The embodiments of the present invention will hereinafter be described in conjunction with the appended drawings that are provided to illustrate and not to limit the present invention, wherein like designations denote like elements, and in which.

DETAILED DESCRIPTION OF THE INVENTION

Figure 1:
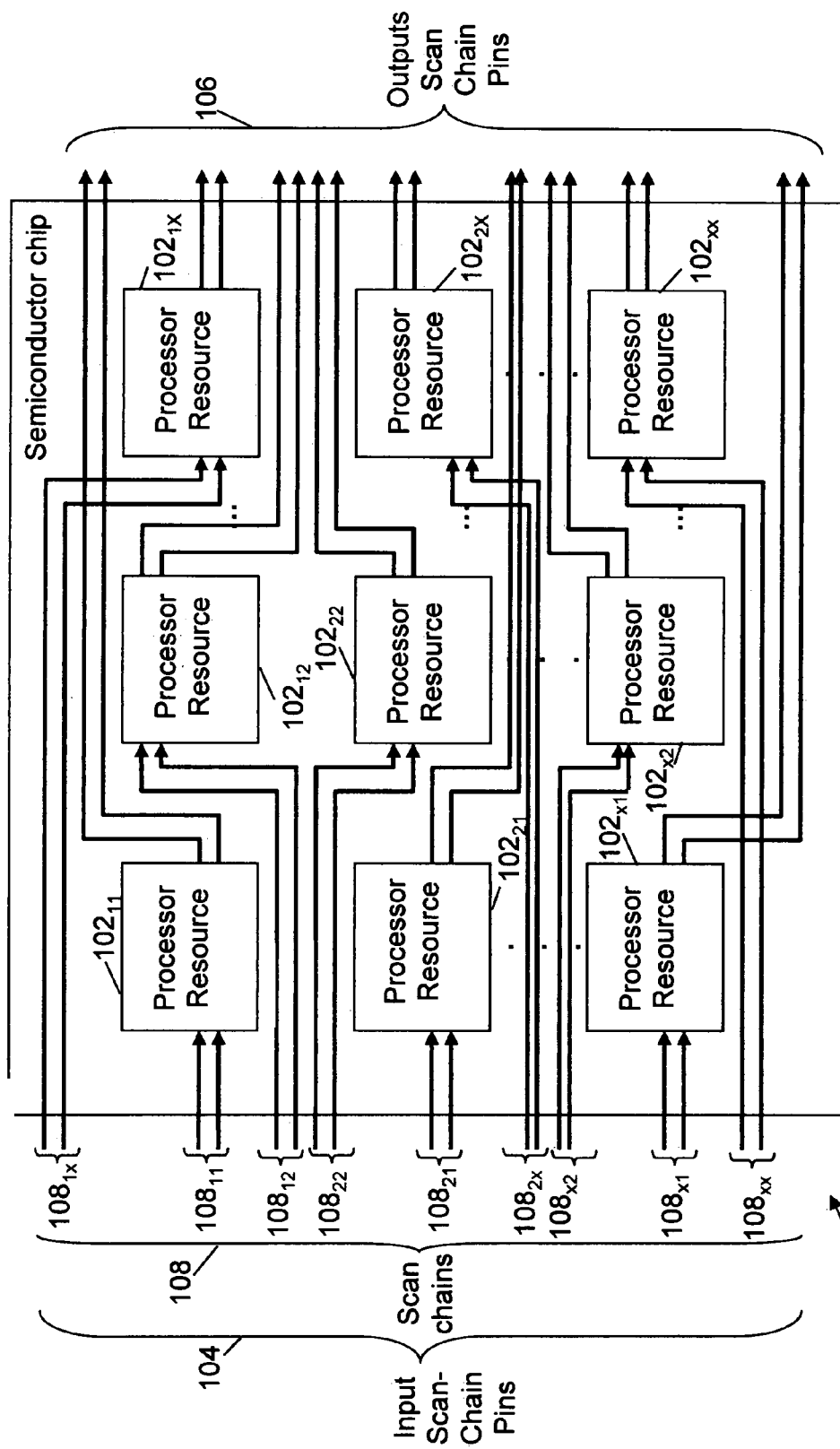
FIG. 1 is a block diagram illustrating a semiconductor chip, wherein routing of a group of scan chains is performed, in accordance with a conventional hierarchical design.

Various embodiments of the present invention relate to a method, system and computer program product for routing a group of scan chains to a group of processor resources designed within a semiconductor chip. The processor resources in the group of processor resources are arranged in a tiled or multicore pattern. These processor resources have computation capabilities to perform various kinds of computational processing on data. Each processor resource within a semiconductor chip receives data from other processor resources. Examples of such processor resources include, but are not limited to, a graphics engine, a floating point engine, and a Media Access Control (MAC). The processor resources are integrated on the semiconductor chip to implement the circuits of various applications. The semiconductor chip is tested to detect errors in the manufacture of the integrated circuit designed within the semiconductor chip.

A test-pattern generator is used to generate test signals to test the semiconductor chip. Examples of a test-pattern generator include, but are not limited to, a Built-in Self Test (BIST) pattern generator and an automatic test-pattern generator (ATPG) such as Mentor Graphic's TestKompress or Synopsys' TetraMAX ATPG. The test signals are routed to different locations in the integrated circuit design of the semiconductor chip. The routing of test signals is performed by using the group of scan chains. Each of the scan chains includes a predefined number of flip-flops (herein referred to as "flops") of the requisite length. A flop is a circuit having two stable states, and its capability of changing from one state to another with the application of a control signal and remaining in that state after removal of the signal is referred to as flop length. The number of flops and the requisite length depends on the semiconductor chip area, the design of the integrated circuit within the semiconductor chip, and the configuration, both on board memory and test pins, of the target test equipment. The group of scan chains route the test signals to different locations within the semiconductor chip. For example, the group of scan chains route the test signals to each of the processor resources in the group of processor resources designed within the semiconductor chip. This is performed, based on the test pattern generated by the test-pattern generator. The routing of the scan chain on a semiconductor chip is usually a critical parameter for designing the semiconductor chip that includes a group of processor resources. This group of processor resources is arranged in a tiled or multicore pattern on the semiconductor chip. Each processor resource in the group of processor resources within the semiconductor chip is connected to adjacent processor resources by using a group of scan chains. In accordance with an embodiment, the first processor resource in each row of processor resources is connected to an input scan-chain pin, and the last processor resource in each row of processor resources is connected to an output scan-chain pin. The test signals generated by the test-pattern generator are transferred to the semiconductor chip. Subsequently, the response of the semiconductor chip to the test signals is analyzed to detect errors in the manufacture of the semiconductor chip. This provides information about the location of the errors within the semiconductor chip.

FIG. 1 is a block diagram illustrating a semiconductor chip 100, wherein routing of a group of scan chains 108 is performed in accordance with a conventional hierarchical design. Semiconductor chip 100 includes a group of processor resources 102 that are fashioned in a tiled manner. The group of scan chains 108 is designed within semiconductor chip 100, based on the conventional hierarchical design. In the conventional hierarchical design, each processor resource in the group of processor resources 102 is connected separately through individual scan chains 108. For example, scan chain $108_{11}$ is individually connected only to processor resource $102_{11}$, $108_{12}$ is connected to processor resource $102_{12}$, and so on. Similarly, scan chain $108_{21}$ is connected to processor resource $102_{21}$, and $108_{22}$ is connected to processor resource $102_{22}$. As shown in the figure, in the conventional hierarchical design, each processor resource is connected to its own scan chain. Thus, each processor resource is connected to input scan-chain pins and output scan-chain pins. For example, processor resources 102 are connected to input scan-chain pins 104. Similarly, processor resources 102 are also connected to output scan-chain pins 106. Input scan-chain pins 104 receive test signals generated by the test-pattern generator. Output scan-chain pins 106 receive outputs corresponding to the test signals sent through input scan-chain pins 104. The outputs are analyzed to detect and locate errors in semiconductor chip 100. The routes of the group of scan chains 108 become lengthy and are cumbersome as the group of processor resources 102 grows in number. For example, scan chain $108_{xx}$ that provides a connection to processor resource $102_{xx}$ is routed through a small chip area, which is the only area left after the other scan chains 108 are routed, connecting all processor resources 102 before processor resource 102 in the last row on semiconductor chip 100. This creates problems such as routing congestion at the top level, timing problems in critical paths, wiring congestion in semiconductor design and the like. These problems are amplified with the increase in the number of processor resources on semiconductor chip 100. They are further exaggerated if the processor resource is located deep in the middle of the group of processor resources 102

Figure 2:
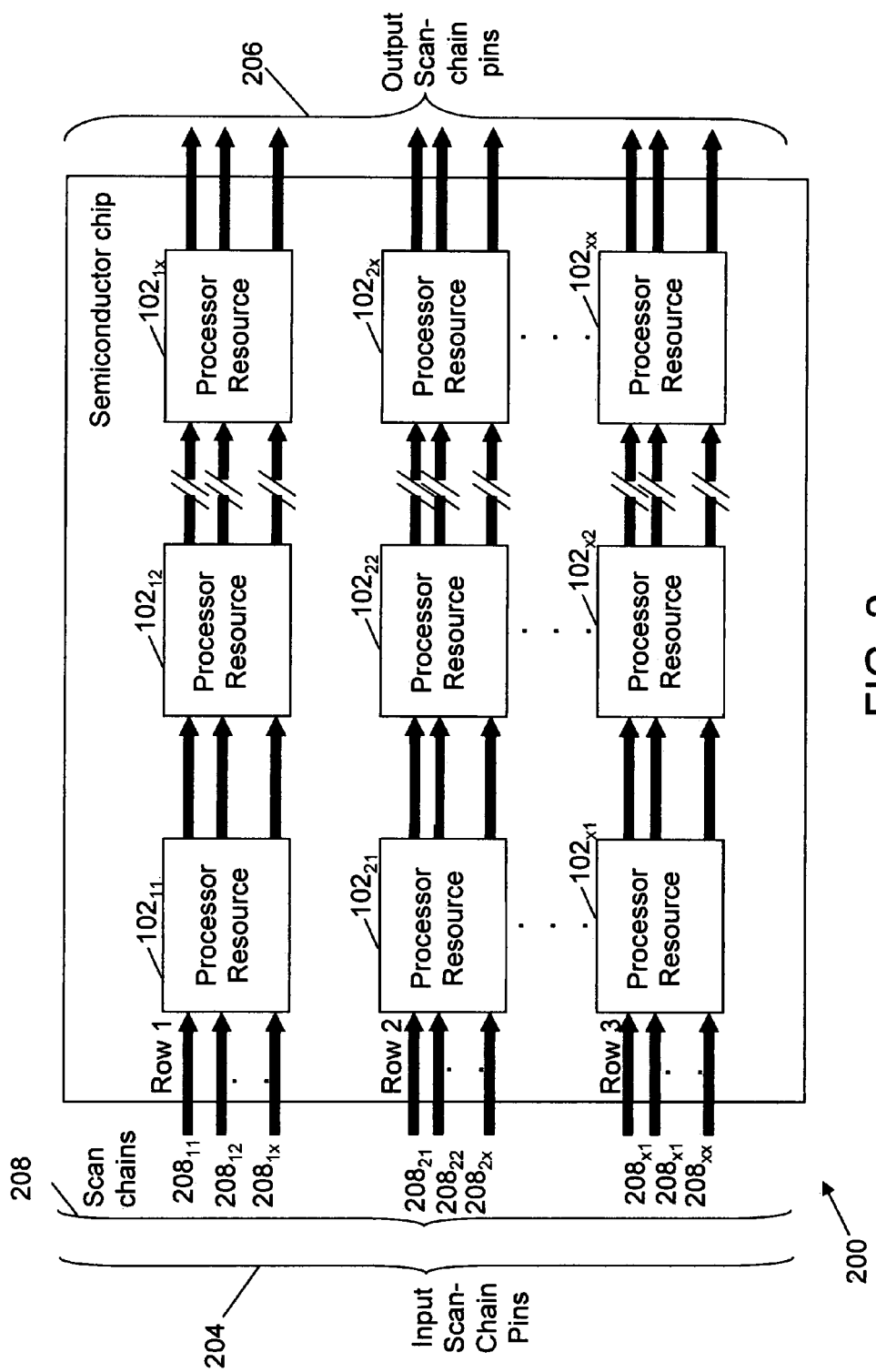
FIG. 2 is a block diagram illustrating the routing of a group of scan chains in a semiconductor chip, in accordance with an embodiment of the present invention.

FIG. 2 is a block diagram illustrating the routing of a group of scan chains 208 in a semiconductor chip 200, in accordance with the present invention. Each processor resource in each of the rows, such as row 1, row 2, and so on, is connected to adjacent processor resources by using scan chains 208 such as scan chain $208_{11}$, $208_{12}$, and so on. Further, scan chains in each row pass through each processor resource in that row. For example, scan chains $208_{11}$-$208_{1x}$ of the first row pass through each processor resource $102_{11}$-$102_{1x}$. Similarly, scan chains $208_{21}$-$208_{2x}$ of the second row pass through each processor resource $102_{21}$-$102_{2x}$. Further, the first and last processor resources in each row are connected to input scan-chain pins and output scan-chain pins, respectively. For example, the first processor resource of the first row, processor resource $102_{11}$, is connected to input scan-chain pins 204. Similarly, the last processor resource of the first row, $102_{1x}$, is connected to output scan-chain pins 206.

It will be appreciated by a person of ordinary skill in the art that the present invention can be applied to processor resources arranged in columns. In such a case, each of the processor resources in each of the columns is connected to adjacent processor resources in the column by using scan chains.

Input scan-chain pins 204 are connected to the test-pattern generator to transfer the test signals to the processor resources 102 through scan chains 208. Output scan-chain pins connect the responses of semiconductor chip 200 that correspond to the test signals. These responses are analyzed and thereafter used to detect an error and its location within semiconductor chip 200. For example, to test processor resource $102_{12}$ in row 1, a test signal generated by the test-pattern generator is sent to input scan-chain pins 204 and is then passed to processor resource $102_{12}$ by routing it through processor resource $102_{11}$ through scan chains $208_{11}$ to $208_{1x}$. In accordance with an embodiment of the invention, the test signal is sent over scan chains 20811 to 2081x, but only one scan chain, say scan chain 20812 is affected for processor resource 10212. Therefore, the test signal passes through scan chain 20812. The response of the test signal at various locations, such as the response to the test signal before passing through processor resource $102_{12}$, the response of the test signal after passing through processor resource $102_{12}$, and the response of the test signal before passing through the next processor resource in the same row, are routed to output scan-chain pins 206 through other processor resources connected in that row. For example, in this case, the response of the test signal passes through processor resources $102_{13}$, $102_{14}$, and so on. (Although not shown in the figure, these processor resources will be present between processor resource $102_{12}$ and $102_{1x}$.) An analysis of these responses provides information about the errors in the design of processor resource $102_{12}$ and the location of the errors as well.

The routing of scan chains 208 is designed such that each scan chain in a certain plurality of scan chains 208 connects all processor resources 102, present in a row, on semiconductor chip 200. For example, scan chains $208_{11}$ to $208_{1x}$, connect processor resource $102_{11}$-$102_{1x}$ in row 1. Hence, the routing of the group of scan chains 208 within semiconductor chip 200 is chip-area efficient, avoids long and multiple routes in the group of scan chains 208, reduces the wire length of the group of scan chains 208, minimizes the timing impact on critical functional signals on semiconductor chip 200, and provides scalability to semiconductor chip 200. Further, the group of scan chains 208 could be efficiently managed.

Further, the routing of scan chains 208 eliminates top-level scan insertion, since the processor resources in each row are connected by using similar scan chains. For example, processor resource $102_{11}$, $102_{12}$, and so on, are connected by using scan chains $208_{11}$ to $208_{1x}$. The routing of scan chains, which are pre-routed in Register Transfer Logic (RTL), eliminates the need to perform scan-chain insertion at the top level of the design resulting in a significantly more efficient method to design semiconductor chip 200. The structured approach of routing scan chains 208 provides scalability to semiconductor chip 200. The increase in the number of processor resources on semiconductor chip 200 does not affect the complexity of the design of semiconductor chip 200, because the geometry of the group of processor resources 102 is structured in a tiled or multicore manner. The connections and routing of the group of scan chains 208 are designed such that if more processor resources are added to semiconductor chip 200, the additional scan chains can be routed through the additional processor resources, without adding complexity to the design of the semiconductor chip 200. Each scan chain in the group of scan chains $208_{11}$ to $208_{1x}$ passes through all the processor resources in a single row on semiconductor chip 200. As a result, by standardizing scan chains 208, scan chains 208 can be connected automatically from one processor resource to another within semiconductor chip 200. This reduces the scan-chain connection between the processor resources 102 to a relatively efficient stub route. Additionally, it enables scan chain routes to scale as the number of processor resources increase and substantially eliminates the extra burden on the top-level routing resources.

Figure 3:
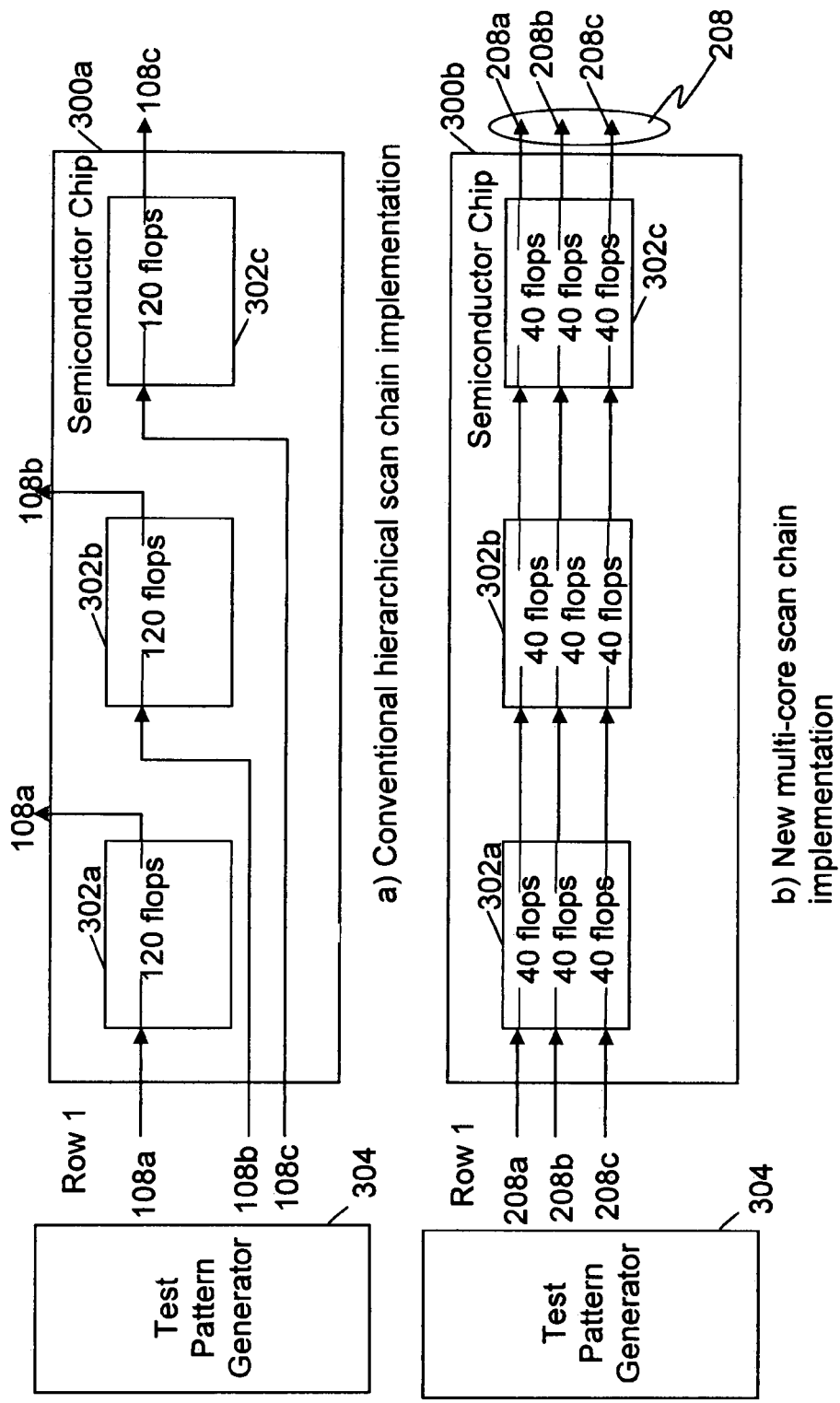
FIG. 3 is a block diagram illustrating an exemplary comparison between the routing of a group of scan chains for one row in a semiconductor chip, in accordance with an embodiment of the present invention and also in accordance with the conventional hierarchical design.

FIGS. 3a and 3b are block diagrams illustrating an exemplary comparison between the routing of a group of scan chains 108 for one row in a semiconductor chip 300 in a conventional hierarchical design and in accordance with an embodiment of the present invention respectively. Semiconductor chip 300a includes a group of scan chains 108, and a group of processor resources 302. The group of processor resources 302 includes processor resource 302a, processor resource 302b, and processor resource 302c. Scan chains 108 include scan chain 108a, scan chain 108b, and scan chain 108c. Scan chains 108 are routed within semiconductor chip 300a and are connected through the group of processor resources 302. The scan chain routing is designed based on the conventional hierarchical scan chain pattern. According to this pattern, each of scan chain 108a, scan chain 108b, and scan chain 108c includes 120 flops. Scan chain 108a, scan chain 108b, and scan chain 108c connect processor resource 302a, processor resource 302b, and processor resource 302c respectively, such that each of the group of scan chains 108 individually connects each processor resource in the group of processor resources 302.

In the conventional hierarchical scan chain pattern, test pattern generator 304 generates test signals. The routing of test signals is performed by using the group of scan chains 108. Scan chains 108 with 120 flops need more chip area than the present invention to implement the scan chain pattern for testing the circuit design within semiconductor chip 300a since each processor in the group of processor resources 302 needs its individual scan chain 108. For example, processor resource 302a, processor resource 302b, and processor resource 302c, are separately connected through their individual scan chain 108a, scan chain 108b, and scan chain 108c respectively. Further, scan chain 108a, scan chain 108b and scan chain 108c individually occupy the area of semiconductor chip 300a, making the design of the scan chain and the routing of the functional signals complex.

Semiconductor chip 300b includes scan chains 208, and a group of processor resources 302. The group of processor resources 302 includes processor resource 302a, processor resource 302b, and processor resource 302c. The group of scan chains 208 route the test signals generated by test pattern generator 304. The group of scan chains 208 include scan chain 208a, scan chain 208b, and scan chain 208c and is routed within semiconductor chip 300b connecting the group of processor resources 302. According to this pattern each of scan chain 208a, scan chain 208b, and scan chain 208c includes 40 flops.

Scan chains 208a, 208b, and 208c pass through each of processor resources 302a, 302b, and 302c. This makes the process of routing the design of the scan chain relatively simpler, as compared to the conventional hierarchical scan-chain pattern. According to present invention patterns, the group of scan chains 208 passes through each of the group of processor resources 302. Further, the wire length of scan chains 208 is reduced from crossing semiconductor chip 300b to simply connecting to its adjacent processor resources. Scan chain 208a, scan chain 208b and scan chain 208c contain the same number of flops, but the new arrangement significantly reduces-the complexity of semiconductor chip 300a and helps to ensure efficient use of the semiconductor chip area.

Figure 4:
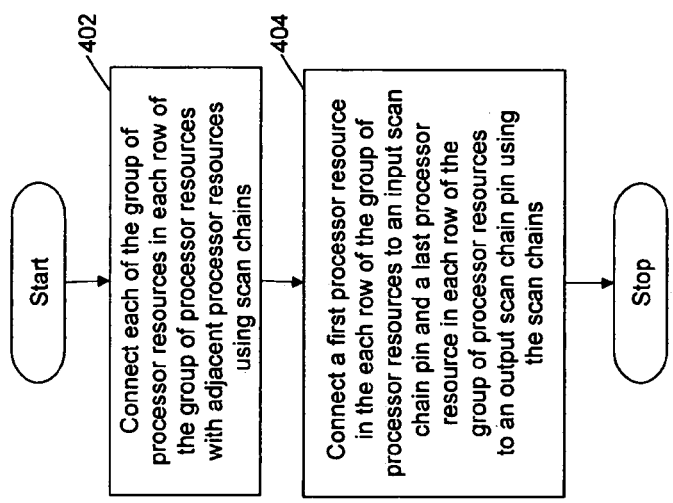
FIG. 4 is a flowchart illustrating the steps for routing a group of scan chains to a group of processor resources designed within a semiconductor chip, in accordance with an embodiment of the present invention.

FIG. 4 is a flowchart illustrating the steps for routing a group of scan chains 208 to a group of processor resources 102 designed within a semiconductor chip 200, in accordance with an embodiment of the present invention. At step 402, each of the group of processor resources 102 in each row of the group of processor resources 102 is connected to adjacent processor resources by using scan chains 208, such as the group of processor resources 102 in row 1 connected through scan chains $208_{11}$ to $208_{1x}$. At step 404, a first processor resource in each row of the group of processor resources 102 is connected to input scan chain pins 204 and a last processor resource in each row of the group of processor resources is connected to output scan chain pins 206 using the group of scan chains 208. For example, processor resource $102_{11}$ is connected to input scan chain pin 204 and processor resource $102_{1x}$ is connected to output scan chain pin 206 by using scan chains $208_{11}$ to $208_{1x}$.

Various embodiments of the present invention provide a routing schematic of scan chains defining-connections and a composition of scan chains to connect a group of processor resources within a semiconductor chip. Routing of scan chains enables efficient use of the chip area, eliminates long scan-chain routes, reduces the wire length of the scan chains, minimizes the timing impact on critical functional signals, and eliminates top-level scan insertion. Additionally, this routing pattern is scalable, since the group of scan chains is linearly connected, because of which processor resources can be added to any row or column of the semiconductor chip.

The system, as described in the present invention or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps constituting the method of the present invention.

The computer system comprises a computer, an input device, a display unit and the Internet. The computer comprises a microprocessor, which is connected to a communication bus. The computer also includes a memory, which may include Random Access Memory (RAM) and Read Only Memory (ROM). Further, the computer system comprises a storage device, which can be a hard disk drive or a removable storage drive such as a floppy disk drive, an optical disk drive, and the like. The storage device can also be other similar means for loading computer programs or other instructions into the computer system.

The computer system executes a set of instructions that are stored in one or more storage elements, to process input data. The storage elements may also hold data or other information, as desired. The storage elements may be an information source or physical memory element present in the processing machine.

The set of instructions may include various commands that instruct the processing machine to execute specific tasks such as the steps that constitute the method of the present invention. The set of instructions may be in the form of a software program. The software may be in various forms such as system software or application software. Further, the software might be in the form of a collection of separate programs, a program module with a larger program, or a portion of a program module. The software might also include modular programming in the form of object-oriented programming. Processing of input data by the processing machine may be in response to user commands, to the results of previous processing, or to a request made by another processing machine.

While the embodiments of the invention have been discussed and described, the invention is not limited to these embodiments only. A number of changes and modifications can be thought of without moving away from the scope of the invention, as discussed in the claims.

What is claimed is:

1. A semiconductor chip comprising:
   a. a plurality of processor resources arranged in one of rows and columns, each processor resource of the plurality of processor resources being connected to one or more adjacent processor resources; and
   b. a plurality of scan chains, the plurality of scan chains connecting each processor resource of the plurality of processor resources in only one of corresponding rows and columns, a first processor resource in each row or each column being connected to input scan chain pins, and a last processor resource in each row or each column being connected to output scan chain pins,
   wherein the plurality of scan chains connecting the plurality of processor resources linearly in corresponding rows or columns facilitates scalability of the semiconductor chip.

2. The semiconductor chip according to claim 1, wherein the plurality of scan chains include a predefined number of flops, the predefined number of flops being based on an area of the semiconductor chip.

3. A method for routing a plurality of scan chains to a plurality of processor resources in a semiconductor chip, wherein the plurality of scan chains transfer test signals generated by a test pattern generator for testing functioning of the plurality of processor resources, the method comprising the steps of:
   a. arranging the plurality of processor resources in one of rows and columns, each processor resource of the plurality of processor resources being connected to one or more adjacent processor resources; and
   b. connecting a plurality of scan chains to each processor resource of the plurality of processor resources in only one of corresponding rows and columns, a first processor resource in each row or each column being connected to input scan chain pins and a last processor resource in each row or each column being connected to output scan chain pins,
   wherein the plurality of scan chains connecting the plurality of processor resources linearly in corresponding rows or columns facilitates scalability of the semiconductor chip.

4. A computer program product for use with a computer, the computer program product comprising a computer usable medium having a computer readable program code embodied therein for routing a plurality of scan chains to a plurality of processor resources in a semiconductor chip, wherein the scan chains are transferring test signals generated by automatic test pattern generation for testing functioning of the plurality of processor resources, the computer program product comprising:
   a. a set of instructions for arranging the plurality of processor resources in one of rows and columns, each processor resource from the plurality of processor resources being connected to one or more adjacent processor resources; and
   b. a set of instructions for connecting a plurality of scan chains to each processor resource of the plurality of processor resources in only one of corresponding rows or columns, a first processor resource in each row or each column being connected to input scan chain pins and a last processor resource in each row or each column being connected to output scan chain pins,
   wherein the plurality of scan chains connecting the plurality of processor resources linearly in corresponding rows or columns facilitates scalability of the semiconductor chip.

* * * * *